United States Patent
Melcher et al.

(10) Patent No.: US 6,413,311 B2
(45) Date of Patent: Jul. 2, 2002

(54) METHOD FOR MANUFACTURING A CERIUM-DOPED LUTETIUM OXYORTHOSILICATE SCINTILLATOR BOULE HAVING A GRADED DECAY TIME

(75) Inventors: Charles L. Melcher, Oak Ridge; Ronald Nutt; Michael E. Casey, both of Knoxville, all of TN (US)

(73) Assignee: CTI, Inc.

( * ) Notice: Subject to any disclaimer, the term of this patent is extended or adjusted under 35 U.S.C. 154(b) by 0 days.

(21) Appl. No.: 09/795,174

(22) Filed: Feb. 28, 2001

Related U.S. Application Data

(63) Continuation-in-part of application No. 09/293,093, filed on Apr. 16, 1999, now abandoned.
(60) Provisional application No. 60/082,129, filed on Apr. 16, 1998.

(51) Int. Cl.$^7$ ............................................... C30B 15/20
(52) U.S. Cl. ....................................................... 117/13
(58) Field of Search ................ 117/13, 937; 252/301.4

(56) References Cited

U.S. PATENT DOCUMENTS

| | | |
|---|---|---|
| 4,958,080 A | 9/1990 | Melcher |
| 5,660,627 A | 8/1997 | Manente et al. |
| 6,323,489 B1 * | 11/2001 | McClellan .............. 250/361 R |

* cited by examiner

Primary Examiner—Felisa Hiteshew
(74) Attorney, Agent, or Firm—Pitts & Brittian, P.C.

(57) ABSTRACT

A Cerium-Doped Lutetium Oxyorthosilicate scintillator boule having a graded decay time. The method for manufacturing an LSO:Ce crystal boule having a decay time gradient decreasing from the top end to the bottom end first includes the step selecting an iridium crucible. The crucible is selected based upon its diameter relative to the diameter defined by said crystal boule. The crucible is also selected based upon its volume relative to the volume of the crystal boule to be grown. A Cerium dopant ($CeO_2$) is added to a mixture of Lutetium Oxide ($Lu_2O_3$) and Silicon Dioxide ($SiO_2$). The composition is heated until melted to define a melt. A seed crystal is then placed in contact with the melt, is rotated, and slowly withdrawn, thereby yielding an LSO:Ce crystal boule defining a decay time gradient.

3 Claims, 4 Drawing Sheets

METHOD FOR MANUFACTURING A CERIUM-DOPED LUTETIUM OXYORTHOSILICATE SCINTILLATOR BOULE HAVING A GRADED DECAY TIME

CROSS-REFERENCE TO RELATED APPLICATIONS

This application is a continuation-in-part of U.S. patent application Ser. No. 09/293,093 filed Apr. 16, 1999 now abandoned, which claimed the benefit of U.S. Provisional Application No. 60/082,129, filed on Apr. 16, 1998.

STATEMENT REGARDING FEDERALLY SPONSORED RESEARCH OR DEVELOPMENT

Not Applicable.

BACKGROUND OF THE INVENTION

1. Field of Invention

This invention relates to the field of tomography devices. More specifically, the present invention is related to a method for manufacturing a scintillator composition having a graded decay time for use in association with tomography devices.

2. Description of the Related Art

In the field of tomography, it is well known to use scintillators for collecting and attenuating data relative to a test subject. Scintillation crystals are known to be grown using the Czochralski technique. In performing tests with scintillator, and specifically with respect to scintillation decay time, it is known to use a pulse shape discrimination technique, absolute calibrated in a Bollinger-Thomas experiment. Each of these techniques is disclosed by Casey M E, Eriksson L, Schmand M, Andreaco M S, Paulus M, Dahlborn M, Nutt R, "Investigation of LSO crystals for high spatial resolution position emission tomography," *IEEE Trans Nucl Sci,* vol 44, 1109–1113, 1997.

It is further known to grow scintillator crystals from various compositions to achieve differing results. U.S. Pat. No. 5,660,627 issued to Manente et al., discloses a method for growing Lutetium Oxyorthosilicate (LSO) crystals. The '627 method uses the Czochralski method and controls the rate of rotation and the diameter of the crystal to produce a crystal exhibiting less variability in scintillation behavior in order to make them suitable for spectroscopic uses.

C. L. Melcher, in U.S. Pat. No. 4,958,080 teaches the use of a Cerium-doped LSO (LSO:Ce) as a scintillator material.

BRIEF SUMMARY OF THE INVENTION

The present invention is a method for manufacturing a Cerium-doped Lutetium Oxyorthosilicate (LSO:Ce) scintillator having a graded decay time. The method for manufacturing an LSO:Ce crystal boule having a decay time gradient decreasing from the top end to the bottom end first includes the step selecting an iridium crucible. The crucible is selected based upon its diameter relative to the diameter defined by said crystal boule. Alternatively, or additionally, the crucible is selected based upon its volume relative to the volume of the crystal boule to be grown. A Cerium dopant ($CeO_2$) is added to a mixture of Lutetium Oxide ($Lu_2O_3$) and Silicon Dioxide ($SiO_2$). The composition is heated until melted to define a melt. A seed crystal is then placed in contact with the melt, is rotated, and slowly withdrawn, thereby yielding an LSO:Ce crystal boule defining a decay time gradient.

BRIEF DESCRIPTION OF THE SEVERAL VIEWS OF THE DRAWINGS

The above mentioned features of the invention will become more clearly understood from the following detailed description of the invention read together with the drawings in which.

DETAILED DESCRIPTION OF THE INVENTION

A method for manufacturing a Cerium-doped Lutetium Oxyorthosilicate (LSO:Ce) scintillator having a graded decay time is provided by the present invention.

Figure 1:
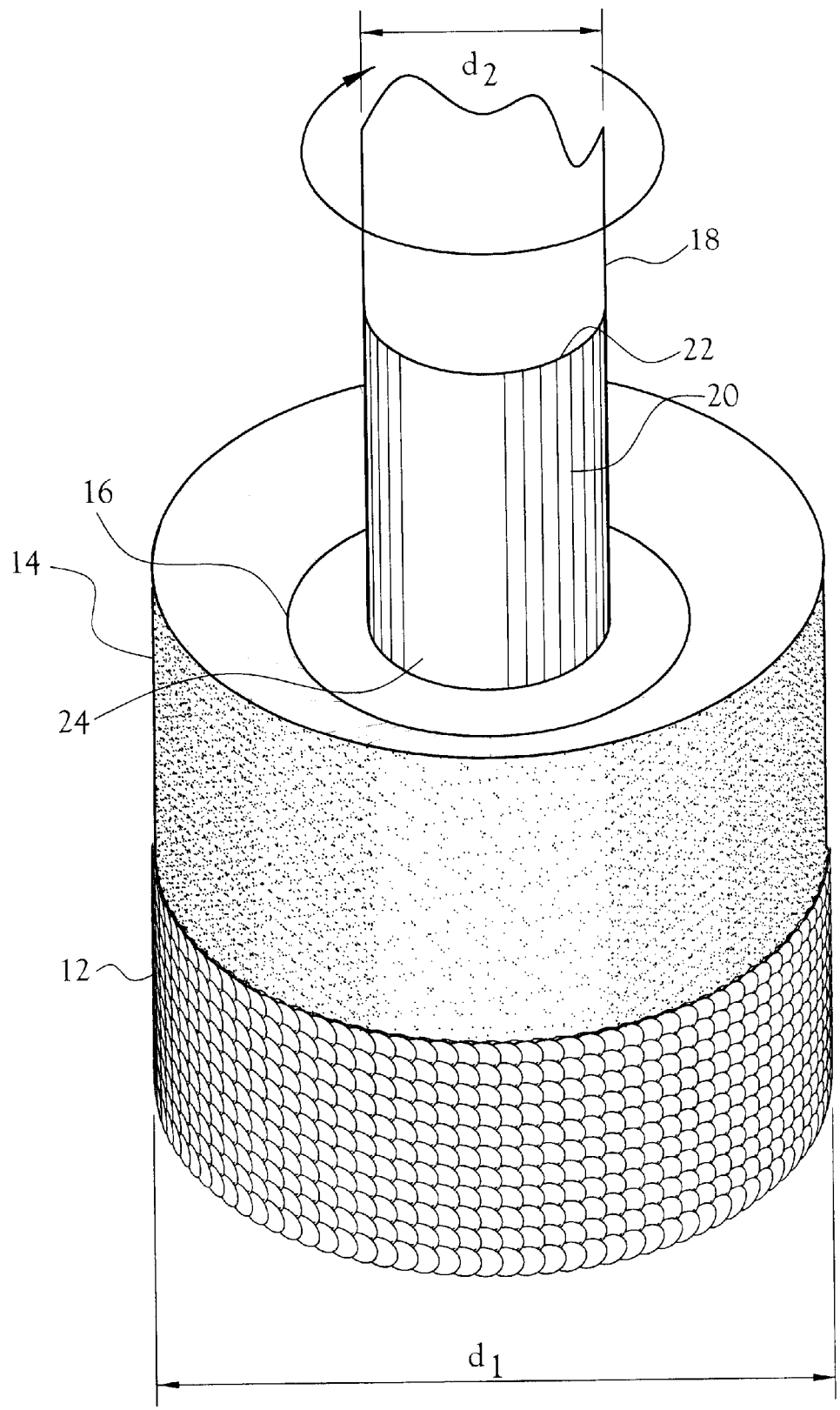
FIG. 1 is a schematic illustration of a crystal boule being grown using the method of the present invention.

A Cerium dopant ($CeO_2$) is added to a mixture of Lutetium Oxide ($Lu_2O_3$) and Silicon Dioxide ($SiO_2$). Each component is at least 99.99% pure. As illustrated in FIG. 1, the starting material and the Ce dopant are placed in the bowl 14 of an iridium crucible 12 in an inert atmosphere and heated at least until melted to define a melt 16. The crucible bowl 14 defines a first diameter $d_1$ and a volume. A seed crystal 18 is used to initiate growth of a crystal boule 20, the growth process being controlled to achieve a crystal boule 20 having a second diameter $d_2$. As the seed crystal 18 is withdrawn, the a crystal boule 20 is grown and the volume of melt 16 within the crucible 12 is reduced. Further, the composition of the melt 20 within the crucible 12 changes as material is withdrawn during crystal growth. Specifically, the melt 20 becomes increasingly enriched with the dopant, Ce. This is caused by a low distribution coefficient of cerium in LSO. The ratio of cerium in the crystal 20 to cerium in the melt is less than one. As a result of the Ce enrichment in the melt, the Ce concentration in the crystal boule 20 reduces as the crystal is grown, thereby yielding a decay time gradient in the crystal boule from the top end 22 proximate the seed crystal 18 to the lower terminating end 24.

In the method of the present invention, approximately seventy percent (70%) of the melt 16 is converted to solid crystal 20. The melt 16 initially has, for example, 0.2% Ce. At the end of crystal growth, the remaining melt 16 in this example has approximately 0.6% Ce. Therefore, at the beginning of the growth, the crystal 20 was growing from melt 16 with 0.2% Ce and near the end of growth was growing from melt 16 with 0.6% Ce.

Similarly, as the melt level in the crucible 12 drops during the growth run, the thermal and atmospheric environments in liquid-solid interface region changes. This affects the incorporation of defects into the crystal 20 which in turn affect the decay time. Both the cerium concentration and melt drop effects are very prominent in the present method due to the large ratio of crystal 20 volume to crucible 12 (or melt 16) volume, which, as indicated above, is approximately seventy percent (70%). Decreasing this ratio reduces or eliminates the decay time gradient, as for example, when the volume of melt 16 used to grow a crystal 20 is reduced to ten percent (10%).

Further, the decay time gradient is dependent upon the relationship between the first diameter $d_1$ defined by the crucible 12 and the second diameter $d_2$ defined by the crystal boule 20. As the diameter $d_1$ of the crucible 12 is increased relative to the diameter $d_2$ of the crystal boule 16, the decay time gradient is reduced, and vise versa. Accordingly, the relative first and second diameters $d_1, d_2$ are selected to produce a desired decay time gradient in the crystal boule 20 to be grown.

By producing such a decay time gradient, crystals having various decay times are cut from the boule in order to be used in various applications. For example, the use of two crystals of differing decay times in a common detector is becoming more useful for acquiring more accurate data in positron emission tomography (PET) applications. Thus, growing scintillator boules with the capability of obtaining the two crystals therefrom, with each crystal having the distinct decay time, is more efficient than growing the two crystals separately.

In development of the scintillator composition of the present invention, a series of tests was performed on 1880 LSO crystals that were cut from 76 crystal boules. Light output and energy resolution of all 1880 crystals were measured, as well as the decay times of 1169 of the crystals. As a result of this particular testing, trends in light output and energy resolution were observed that were not previously evident from studies of small numbers of crystals, and in addition, a correlation between light output and decay time became evident for the first time. The results may be interpreted in terms of the properties of the two Ce scintillation centers in LSO, the effect of quenching centers, and the effects of Ce segregation during crystal growth.

As LSO was being developed as a new scintillator, most investigations of its properties focused on detailed measurements of small numbers of samples. Due to the recently increased production of LSO, much larger numbers of crystals are now available for analysis.

In the subject study, the scintillation characteristics of 76 boules of LSO:Ce were examined. 1169 crystals measuring 19×19×7.5 mm were cut from the first set of 19 boules; 340 crystals measuring 60 mm dia.×10 mm thick were cut from the second set of 29 boules; and 371 crystals measuring 60 mm dia.×7.5 mm thick were cut from the third set of 28 boules. As mentioned above, the light output and energy resolution of all 1880 crystals was measured, as well as the decay times of the 1169 crystals from the first set of boules.

The Czochralski technique was used to grow LSO crystal boules from iridium crucibles in an inert atmosphere. The starting materials used were $Lu_2O_3$, $SiO_2$, and $CeO_2$, and were at least 99.99% pure. The same concentration of the Ce dopant was used for all growth runs. The boules were 5 to 6 cm in diameter and approximately 20 cm long. For light output and energy resolution measurements, each crystal was excited with 511 keV gamma rays from a 10 $\mu$Ci $^{22}$Na source located approximately 2 cm from the crystal surface. The crystal was covered with a Teflon reflector, and the scintillation light was detected by a Hamamatsu R877 bi-alkali photomultiplier. To measure the scintillation decay time a pulse shape discrimination technique, absolute calibrated in a Bollinger-Thomas experiment, was used. Both of these techniques are described by Casey M E, Eriksson L, Schmand M, Andreaco M S, Paulus M, Dahlborn M, Nutt R, "Investigation of LSO crystals for high spatial resolution position emission tomography," *IEEE Trans Nucl Sci*, vol 44, 1109–1113, 1997.

Figure 2:
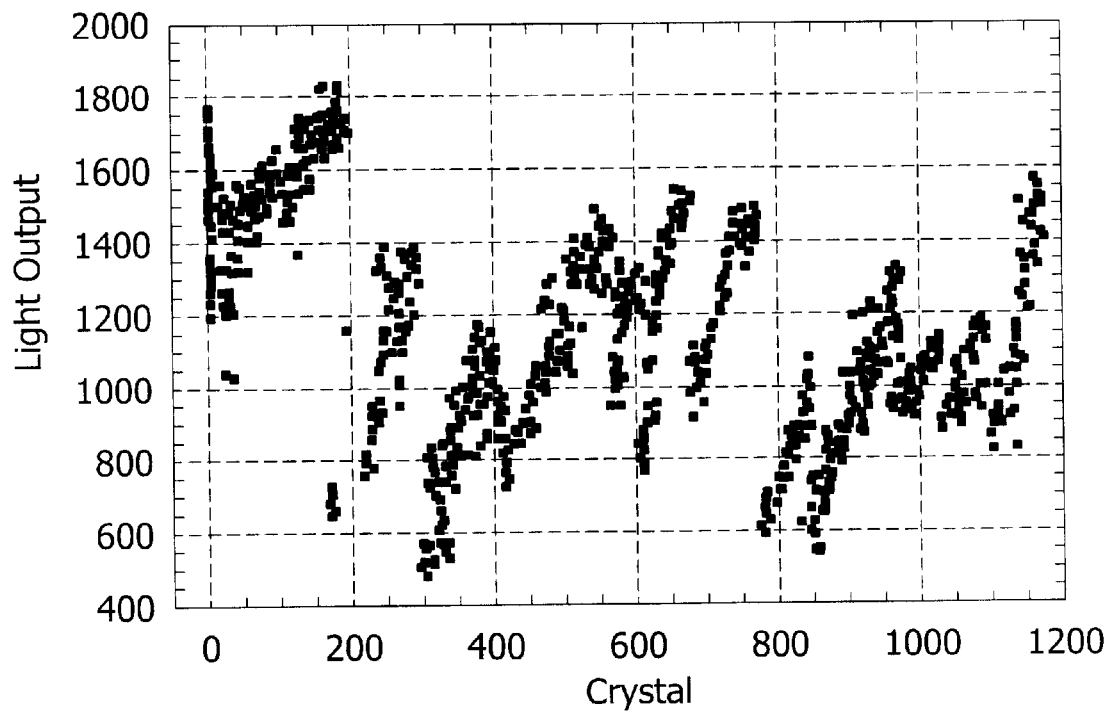
FIG. 2 is a graphical illustration of the test results of the light output of 6 cm diameter×1 cm thick crystals of the composition of the present invention.
Figure 3:
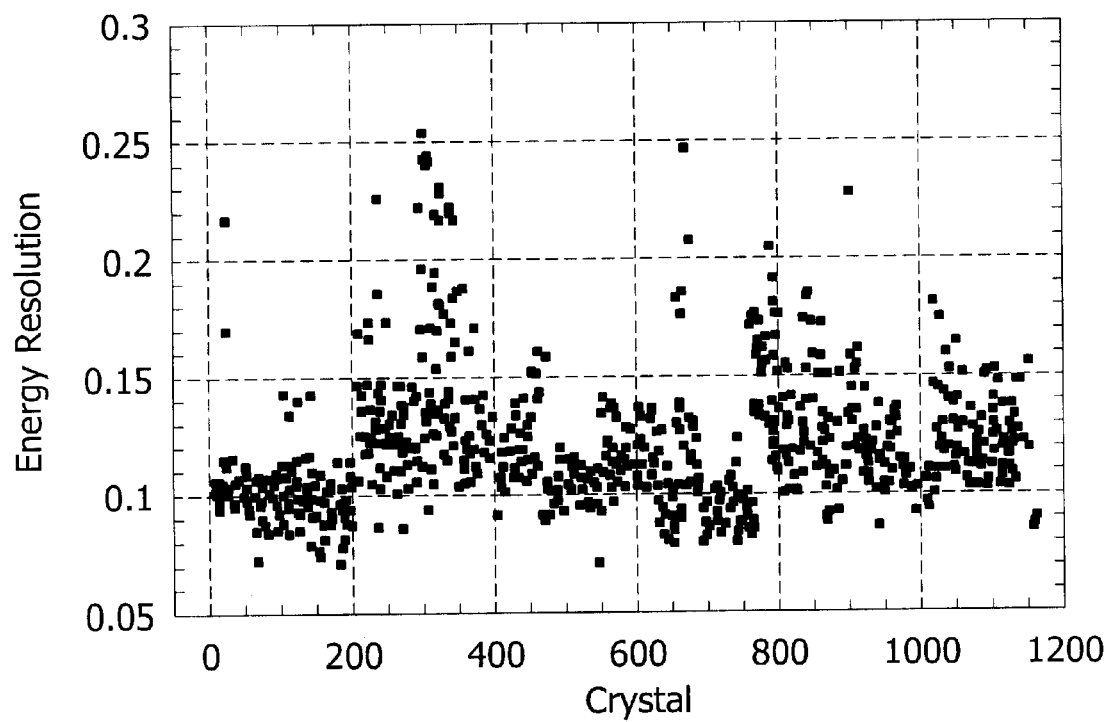
FIG. 3 is a graphical illustration of the energy resolutions of the scintillator crystals used in the tests illustrated in FIG. 2 at 511 keV.

FIG. 2 shows the light output of the 6 cm diameter×1 cm thick crystals. The crystals are grouped together according to the boule from which they were cut and are numbered in order of increasing distance from the bottom of the boule. The light output typically increases approximately 30–40% from the bottom to the top of the boule. The energy resolutions of the 6 cm diameter×1 cm thick crystals at 511 keV are shown in FIG. 3. Most of the crystals have between 12 and 20% energy resolution.

Figure 4:
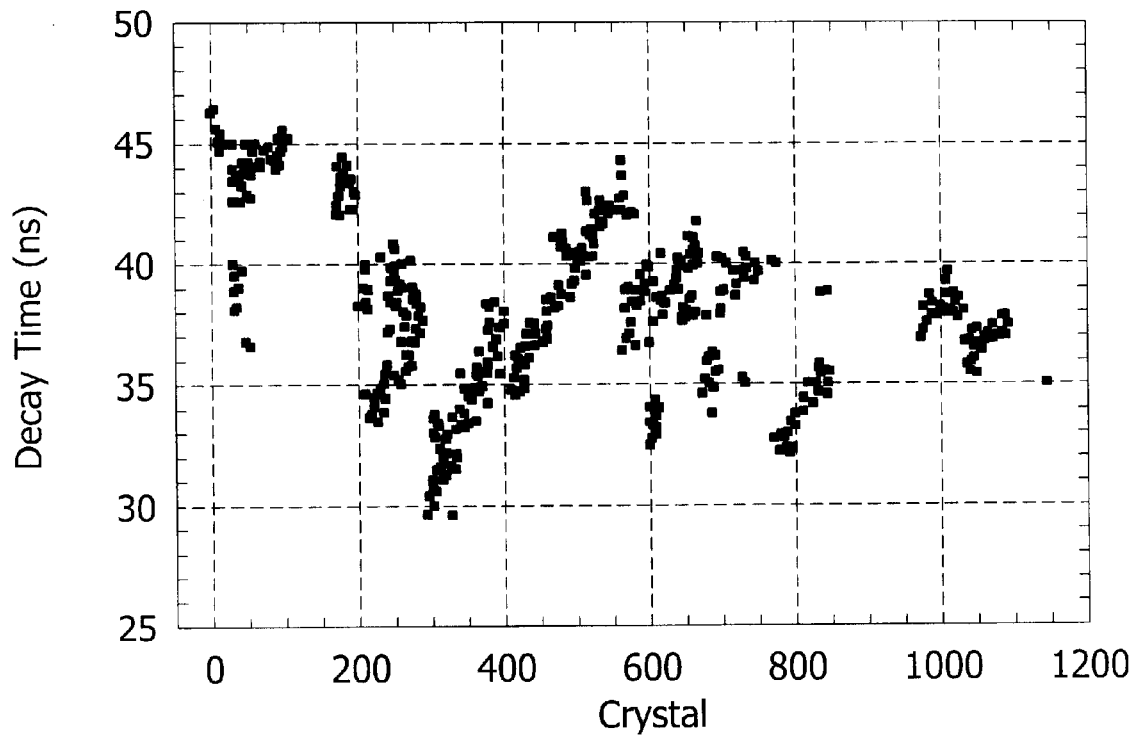
FIG. 4 is a graphical illustration of the decay time of 19×19×7.5 mm crystals fabricated from the composition of the present invention.
Figure 5:
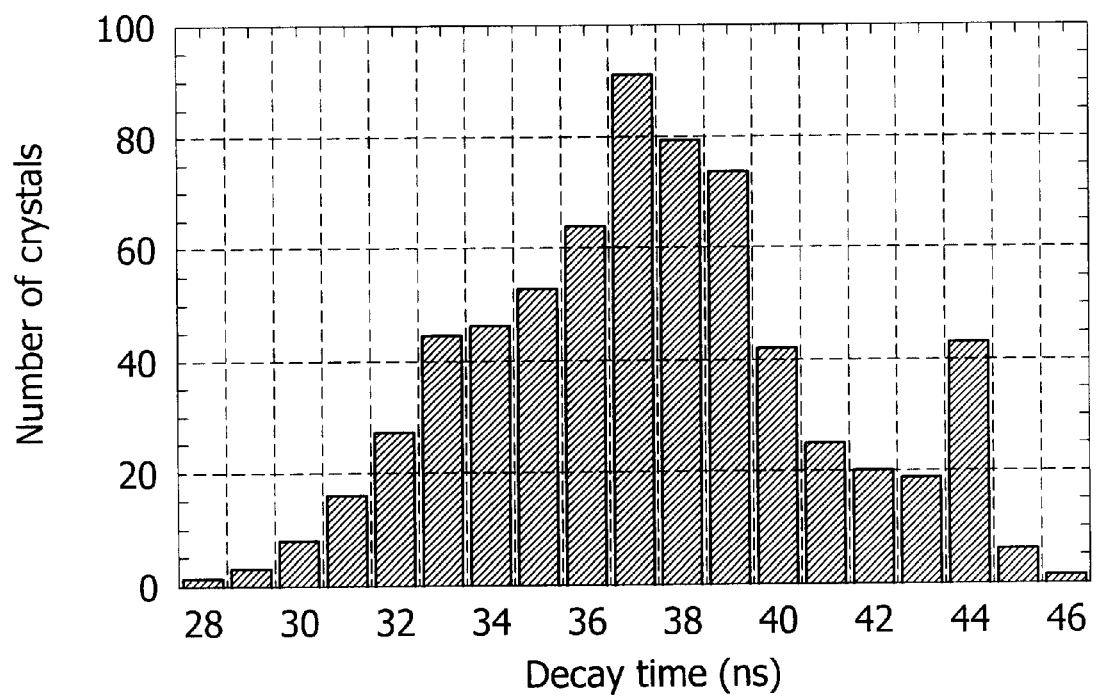
FIG. 5 is a graphical illustration of the distribution of decay times among 1169 crystals that were measured.

FIG. 4 shows the decay time of the 19×19×7.5 mm crystals. The decay time typically increases by approximately 4 ns from the bottom to the top of a boule. FIG. 5 shows the distribution of decay times among the 1169 crystals that were measured. The decay times range from a minimum of 29 ns to a maximum of 46 ns with a median value of 37 ns.

Figure 6:
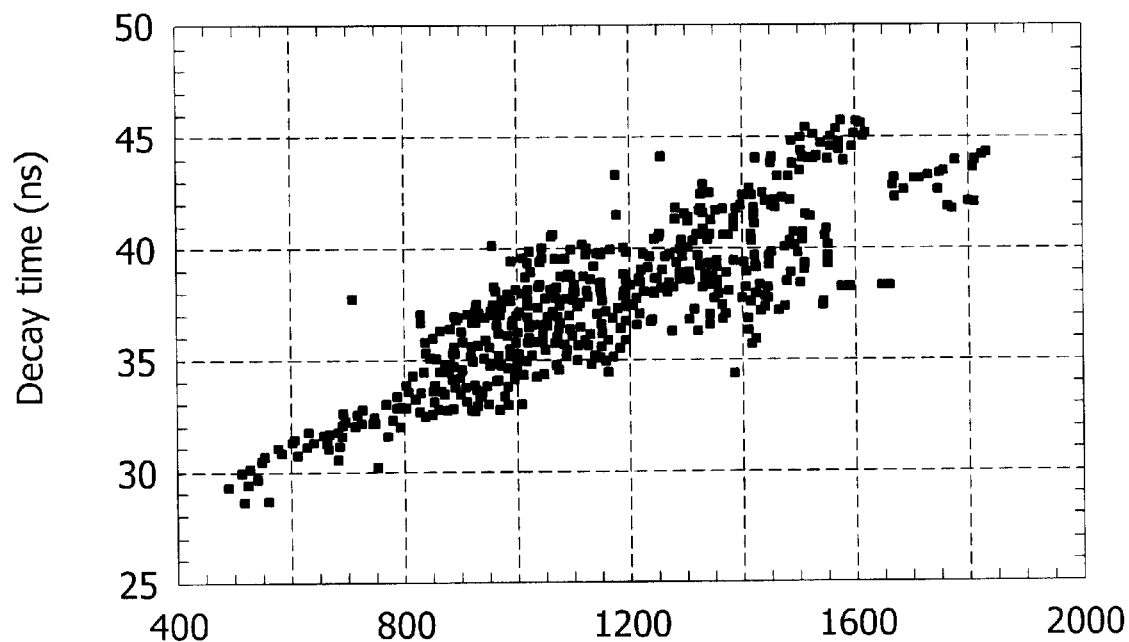
FIG. 6 is a graphical illustration of decay time versus light output for scintillator crystals of the present invention measuring 19×19×7.5 mm.
Figure 7:
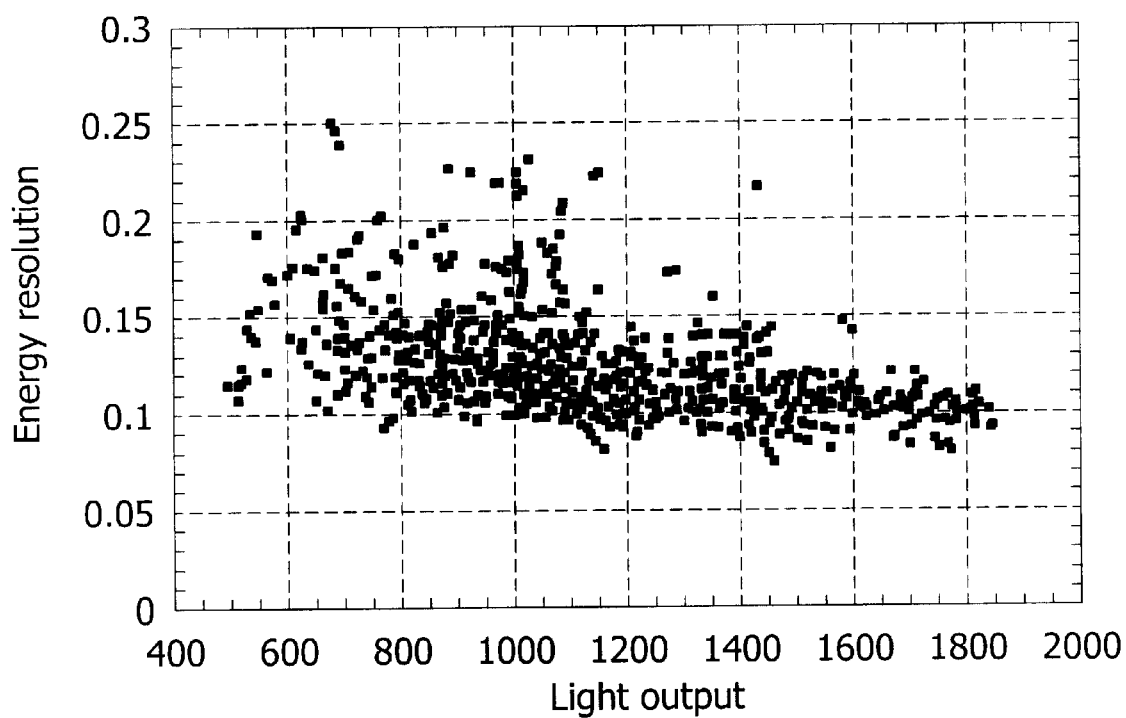
FIG. 7 is a graphical illustration of the relationship between energy resolution and light output of the scintillator of the present invention.

FIG. 6 shows the decay time versus light output for the 19×19×7.5 mm crystals. Although there is considerable variation in decay time for a given light output, there is nonetheless a distinct trend of higher light output being correlated with longer decay times. Finally, FIG. 7 shows the relationship between energy resolution and light output. The crystals with the best energy resolution tend to have the highest light output.

From previous studies, the two Ce luminescence centers are known to have different decay times, and the small distribution coefficient of Ce in LSO influences the relative contributions from these centers both in light output and in decay time. In addition, quenching centers both reduce light output and shorten decay time.

From the foregoing description, it will be recognized by those skilled in the art that an LSO:Ce scintillator having a graded decay time offering advantages over the prior art has been provided.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention,
We claim:

1. A method for fabricating a Cerium-doped lutetium oxyorthosilicate (LSO:Ce) crystal boule defining a top end and a bottom end and having a decay time gradient decreasing from said top end to said bottom end, said method comprising the steps of:

a) selecting an iridium crucible defining a bowl having a first diameter, said first diameter being selected relative to a second diameter defined by said crystal boule;

b) mixing a Cerium dopant ($CeO_2$) with a mixture of Lutetium Oxide ($Lu_2O_3$) and Silicon Dioxide ($SiO_2$) in said iridium crucible;

c) melting said $CeO_2$, $Lu_2O_3$, and $SiO_2$ to form a melt composition;

d) positioning a seed crystal in said iridium crucible to contact a surface of said melt composition;

e) rotating said seed crystal; and f) drawing said seed crystal away from said crucible during said step of rotating said seed crystal, thereby forming said crystal boule to define a second diameter.

2. A method for fabricating a Cerium-doped lutetium oxyorthosilicate (LSO:Ce) crystal boule defining a top end and a bottom end and having a decay time gradient decreasing from said top end to said bottom end, said method comprising the steps of:

a) selecting an iridium crucible defining a bowl having a first volume, said first volume being selected relative to a second volume defined by said crystal boule;

b) mixing a Cerium dopant ($CeO_2$) with a mixture of Lutetium Oxide ($Lu_2O_3$) and Silicon Dioxide ($SiO_2$) in said iridium crucible;

c) melting said $CeO_2$, $Lu_2O_3$, and $SiO_2$ to form a melt composition;

d) positioning a seed crystal in said iridium crucible to contact a surface of said melt composition;

e) rotating said seed crystal; and f) drawing said seed crystal away from said crucible during said step of rotating said seed crystal, thereby forming said crystal boule to define a second diameter.

3. A method for fabricating a Cerium-doped lutetium oxyorthosilicate (LSO:Ce) crystal boule defining a top end and a bottom end and having a decay time gradient decreasing from said top end to said bottom end, said method comprising the steps of:

a) selecting an iridium crucible defining a bowl having a first diameter, said first diameter being selected relative to a second diameter defined by said crystal boule;

b) selecting said iridium crucible wherein said bowl defines a first volume, said first volume being selected relative to a second volume defined by said crystal boule;

c) mixing a Cerium dopant ($CeO_2$) with a mixture of Lutetium Oxide ($Lu_2O_3$) and Silicon Dioxide ($SiO_2$) in said iridium crucible;

d) melting said $CeO_2$, $Lu_2O_3$, and $SiO_2$ to form a melt composition;

e) positioning a seed crystal in said iridium crucible to contact a surface of said melt composition;

f) rotating said seed crystal; and g) drawing said seed crystal away from said crucible during said step of rotating said seed crystal, thereby forming said crystal boule to define a second diameter.

* * * * *